United States Patent [19]
Yasui

[11] 3,949,382
[45] Apr. 6, 1976

[54] MISFET CIRCUIT FOR READING THE STATE OF CHARGE

[75] Inventor: Tokumasa Yasui, Kodaira, Japan

[73] Assignee: Hitachi, Ltd., Japan

[22] Filed: Oct. 16, 1974

[21] Appl. No.: 515,412

[30] Foreign Application Priority Data
Dec. 10, 1973  Japan............................... 48-136787

[52] U.S. Cl. ........ 340/173 R; 307/291; 340/173 FF; 340/173 CA
[51] Int. Cl.² G11C 7/06; G11C 11/24; G11C 11/40
[58] Field of Search.... 340/173 FF, 173 CA, 173 R; 307/291, 238

[56] References Cited
UNITED STATES PATENTS

| | | | |
|---|---|---|---|
| 3,714,638 | 1/1973 | Dingwall et al. | 340/173 FF |
| 3,774,176 | 11/1973 | Stein et al. | 340/173 FF |
| 3,795,898 | 3/1974 | Mehta et al. | 340/173 FF |

*Primary Examiner*—Stuart N. Hecker
*Attorney, Agent, or Firm*—Craig & Antonelli

[57] ABSTRACT

In an MIS type semiconductor memory device which has at least two parasitic capacitors and which delivers, at its outputs, the state of charge accumulated in at least one of the parasitic capacitors, the respective parasitic capacitors are provided with inverter circuits. Each of the inverter circuits receives, as an input signal, the state of charge accumulated in the corresponding parasitic capacitor. When charges accumulated by precharging are to be discharged, each inverter forms a discharging path for the opposite parasitic capacitor.

5 Claims, 7 Drawing Figures

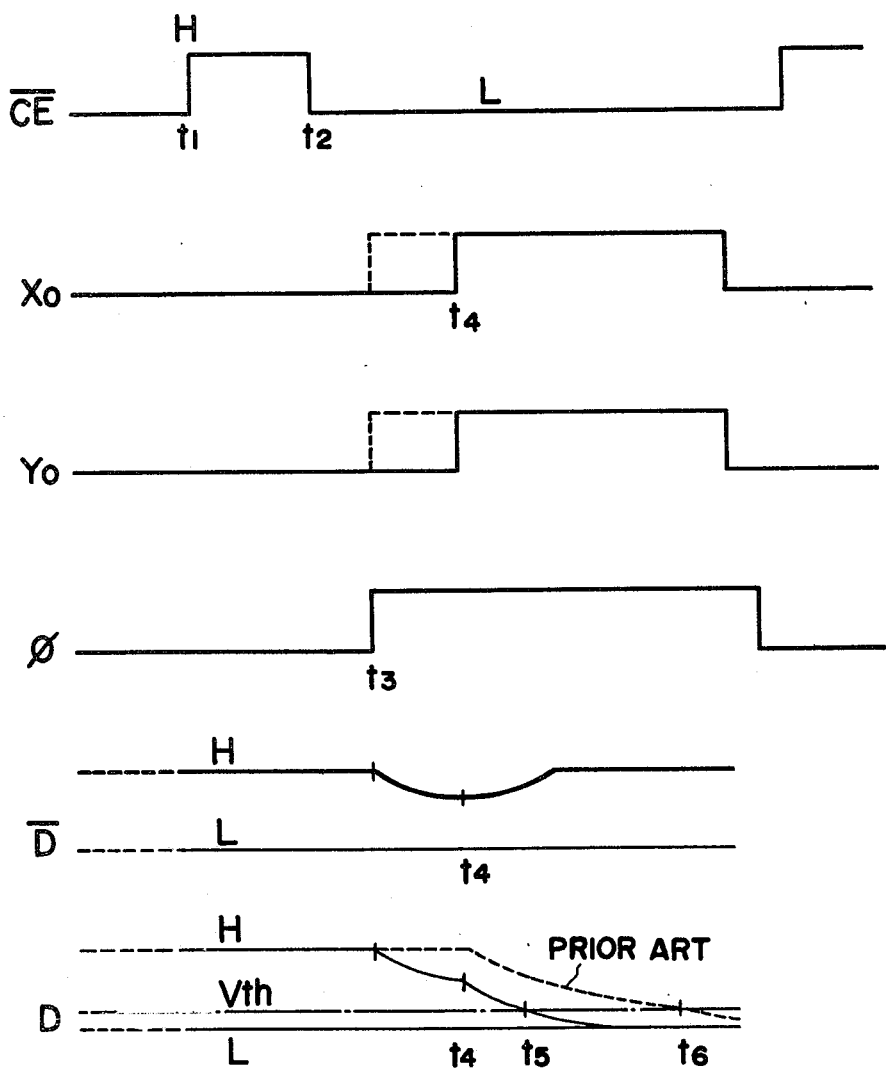

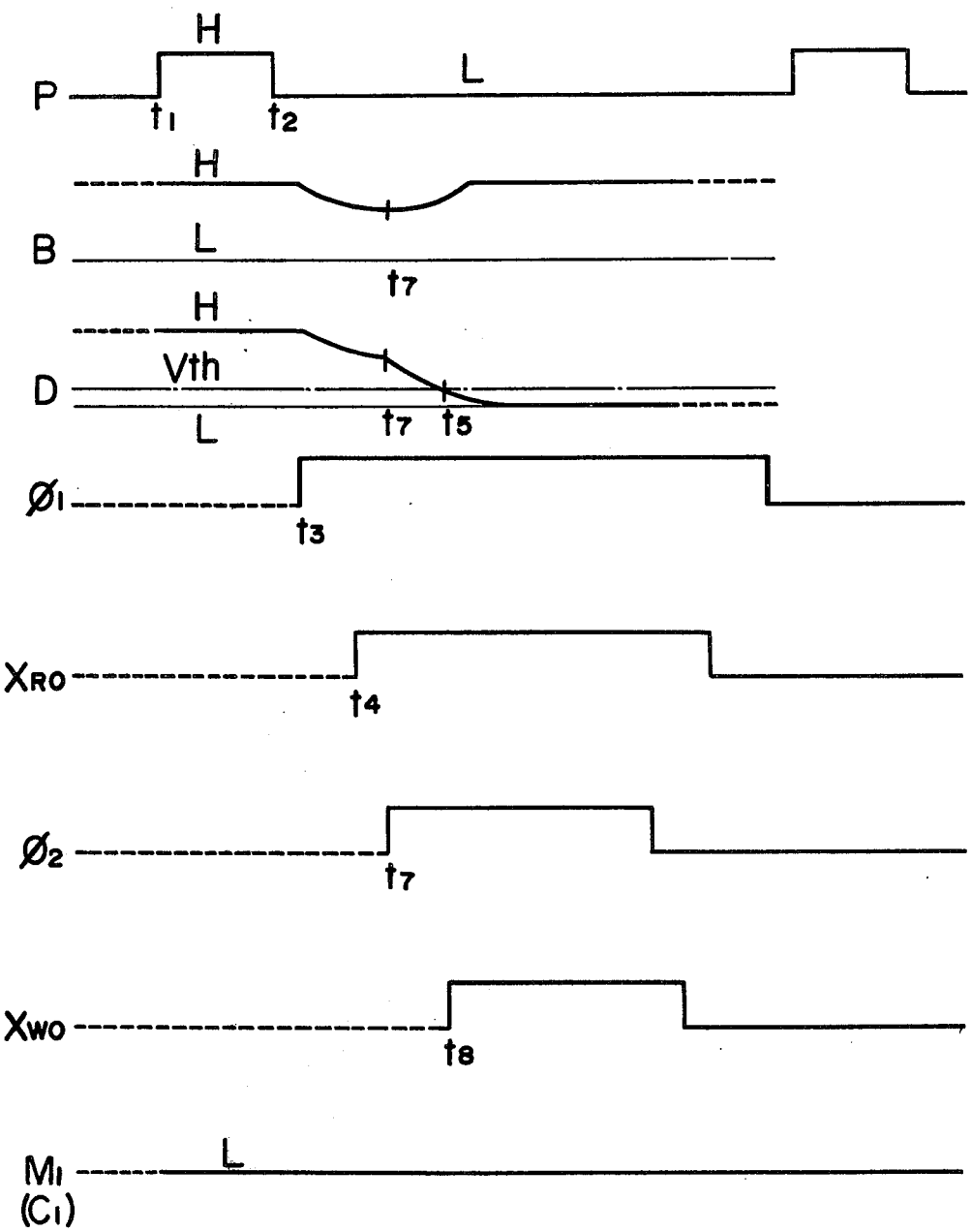

MISFET CIRCUIT FOR READING THE STATE OF CHARGE

BACKGROUND OF THE INVENTION

1. Field of the Invention

The present invention relates to a MISFET (insulated gate field-effect transistor) circuit. More particularly, it relates to a MISFET circuit which provides high-speed operation in an MIS type semiconductor memory device.

2. Description of the Prior Art

The chip of an MIS memory of high density is based on a memory cell system which exploits the fact that, during operation, the input current of a MISFET is substantially zero. Charges accumulated in a cell decrease gradually due to leakage at a junction associated with elements for access and for sense operations. In such a cell, therefore, it is necessary to periodically perform an access operation for refreshing the accumulated charge. That is, a dynamic operation is carried out.

The dynamic memory cell generally utilizes 3-element type and 4-element type cells.

In the cell of the 3-element type, as shown in FIG. 3, information is accumulated as a charge on capacitor $C_1$ at the gate of a MISFET $M_1$ which is an active element of comparatively large size. Upon access to the cell, at the beginning of a cycle, the voltages at a terminal D and at terminal B are preestablished at a voltage nearly equal to the supply voltage $V_{DD}$. When a read select line is subsequently enabled MISFET $M_2$, the transmitting information, becomes conductive. If the voltage of the gate of the MISFET $M_1$ is greater than the threshold voltage, the MISFET $M_1$ will conduct, and the voltage level at terminal B will drop to a voltage near source voltage $V_{SS}$. If the gate voltage of the MISFET $M_1$ (charge on the gate capacitance $C_1$) is insufficient and the MISFET $M_1$ cannot be rendered conductive, the terminal B will remain preset at the supply voltage $V_{DD}$. The state of the column B is sensed by an on-chip amplifier, to thereby detect information.

FIG. 4 shows a dynamic memory cell of the 4-element type. Four active elements are connected forming a latch circuit similarly to flip-flops which are used in a static memory. This cell, however, is dynamic, since no load element is employed.

Information is stored in the gate capacitors $C_4$ and $C_5$ of MISFETs $M_4$ and $M_5$. As two elements are used, both normal information and reverse information are obtained by internal detector circuits.

The information is acquired through information transmitting MISFETs $M_6$ and $M_7$ substantially in the same way as in the case of the 3-element type. At the beginning of a cycle, the voltages at terminal D and terminal $\overline{D}$ are preset at a voltage near the supply voltage $V_{DD}$. When the row is subsequently selected, the information transmitting MISFETs $M_6$ and $M_7$ conduct. If a charge has been accumulated on the gate capacitor $C_4$, the MISFET $M_4$ will conduct and the voltage at terminal D will therefore drop to a voltage near source voltage $V_{SS}$. The voltage at the other terminal $\overline{D}$ remains preset since MISFET $M_5$ is nonconductive.

Although the memory of this element type produces the two forms of output information D and $\overline{D}$, actually the information of either the terminal D or the terminal $\overline{D}$ may be used as the read-out signal.

The above memories of the dynamic type have a small number of elements and, moreover, have a low power dissipation, since no DC current is caused to flow. They are, therefore, very convenient for constructing a memory device of large capacity.

On the other hand, the dynamic type memory cell is so formed as to make the best use of the high integration density being one of its features, and hence, each MISFET is inevitably made small. This leads to the disadvantage that the output impedance of each MISFET is high, to render to operation of the device slow. More specifically, as previously stated, the operation of the dynamic type memories is such that, after determining whether or not charges preestablished in the line of the columns are discharged by the storing information of the memory cell, information is read out. The access time is therefore determined from the instant of designation of the memory cell to the read-out of information.

Since the impedance of the MISFET of the memory cell which constitutes the discharging path is high, as described above, the time necessary for discharge or the access time is long.

SUMMARY OF THE INVENTION

The present invention therefore intends to shorten the necessary discharging time by circuit means, without lowering the output impedance of each MISFET of the memory cell, that is, with the high integration density maintained. Its object is to provide a semiconductor memory device whose operation is made highly speedy.

The fundamental construction of the present invention for accomplishing this object consists in a MISFET circuit which comprises at least two parasitic capacitors, means to precharge the parasitic capacitors, and means to discharge the charges accumulated in one of the parasitic capacitors adter completion of precharging, and from which the state of charge in at least one of the two parasitic capacitors is delivered as an output, the MISFET circuit being characterized in that the respective parasitic capacitors are provided with inverter circuits, each of which receives, as an input signal, the state of charge accumulated in the corresponding one of the parasitic capacitors and each of which, upon discharge of the charge accumulated by precharging, forms a discharging path for the other parasitic capacitor in dependence on the state of the charge in the one parasitic capacitor.

BRIEF DESCRIPTION OF THE DRAWINGS

FIGS. 5, 6A and 6B are timing diagrams for illustrating the operation of the circuits of FIG. 1 and FIG. 2, respectively.

DETAILED DESCRIPTION OF THE INVENTION

Hereunder, the present invention will be concretely described as to its embodiment with reference to the accompanying drawings.

Figure 1:
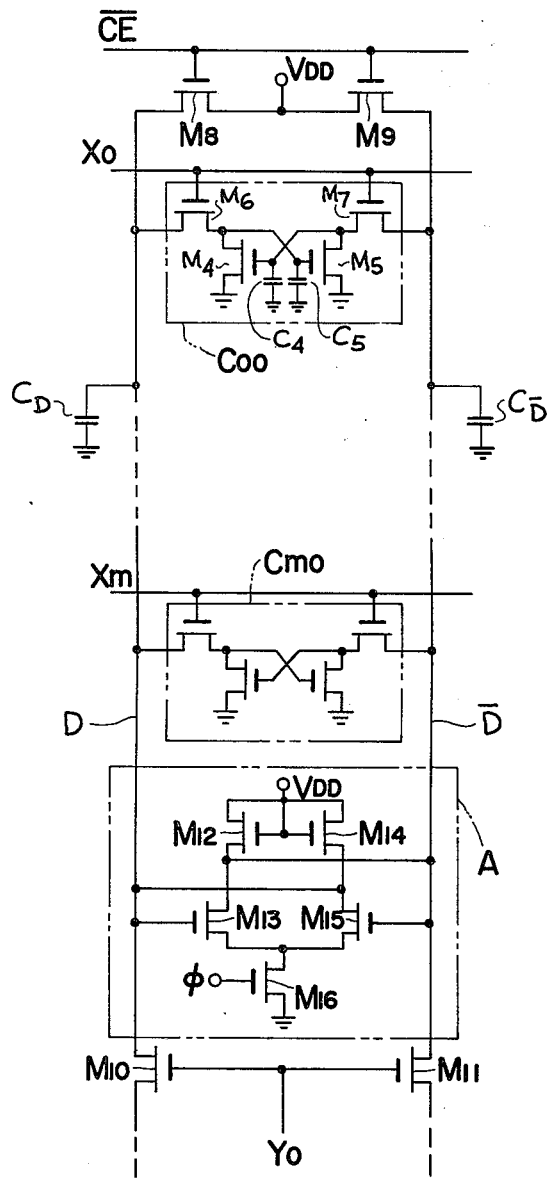
FIGS. 1 and 2 are circuit diagrams each showing an embodiment of the present invention.

FIG. 1 shows an embodiment in which the present invention is applied to a semiconductor memory device of the 4-element type.

Figure 4:
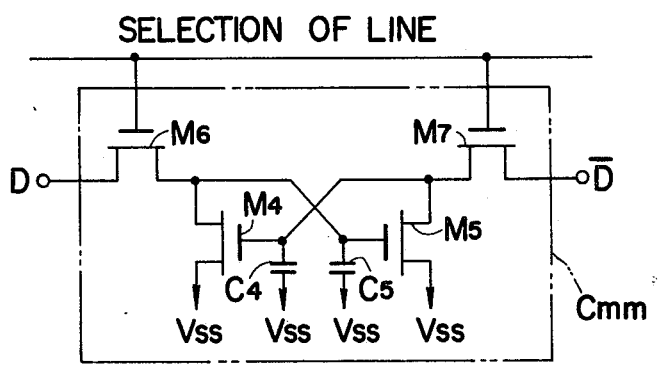
FIG. 4 shows a prior art memory cell of the 4-element type.

The figure illustrates only one column, for example, the zero column (0), of a semiconductor memory device which has such a construction that memory cells as shown in FIG. 4 are arranged in $m$ rows and $n$ columns.

In the illustrated column, the input and output terminals of the $m$ memory cells $C_{oo} - C_{mo}$ are commonly connected to form sub-columns D and $\bar{D}$. MISFETs $M_8$ and $M_9$ are transistors for precharging the parasitic capacitors $D_D$ and $C_{\bar{D}}$ of the sub-columns D and $\bar{D}$, and have a chip enable signal $\overline{CE}$ applied thereto. MISFETs $M_{10}$ and $M_{11}$ are gate transistors for selecting the column. They are applied with a column select signal $Y_o$, and are connected to a write-in circuit and a read-out circuit.

In the above circuit, the present invention incorporates a circuit as shown by broken lines A wherein two inverters ($M_{12}$, $M_{13}$), ($M_{14}$, $M_{15}$) composed of load MISFETs $M_{12}$, $M_{14}$ and driver MISFETs $M_{13}$, $M_{15}$ are connected in parallel and wherein a MISFET $M_{16}$ is connected in series between the parallel circuit and a source voltage terminal. The inputs of the inverters in the circuit are connected to the corresponding sub-columns D and $\bar{D}$, while the outputs are connected to the opposite sub-columns $\bar{D}$ and D. To the gate of the MISFET $M_{16}$ a control signal $\phi$ is applied, which is in synchronism with a row select signal $X_o$.

According to this configuration, the present invention operates as follows:

1. In response to a chip enable signal $\overline{CE}$, the MISFETs $M_8$ and $M_9$ become conductive and the sub-columns D and $\bar{D}$ are connected to the supply voltage $V_{DD}$. Consequently, the parasitic capacitors $C_D$ and $C_{\bar{D}}$ of the sub-columns D and $\bar{D}$ become precharged.

2. Let it be now supposed that row O is subsequently selected. Then, in response to a row select signal $X_o$, the information transmitting MISFETs $M_6$ and $M_7$, of the memory cells $C_{oo} - C_{on}$ (only the cell $C_{oo}$ is shown in the figure) and made conductive, to discharge the charges accumulated in either of the parasitic capacitors $C_D$ and $C_{\bar{D}}$ of the sub-columns D and $\bar{D}$ of each column. At this time, the memory device according to the present invention can shorten the discharging period of time by means of the MISFET circuit at A included in each column.

More specifically, considering the column O by way of example, MISFET $M_{16}$ of the MISFET circuit A is rendered conductive by the control signal $\phi$ synchronized with the row select signal $X_o$. Consequently, the MISFET $M_{13}$ of the inverter, the input terminal of which is connected to the sub-column D, forms a discharging path for the parasitic capacitor $C_{\bar{D}}$ of the sub-column $\bar{D}$, while the MISFET $M_{15}$ of the inverter, the input terminal of which is connected to the sub-column $\bar{D}$, forms a discharging path for the parasitic capacitor $C_D$ of the sub-column D. The charges in both the parasitic capacitors $C_D$ and $C_{\bar{D}}$ of the sub-columns D and $\bar{D}$ are, therefore, discharged. Since, however, the memory cell $C_{oo}$ forms a discharge path for only one of the parasitic capacitors $C_D$ and $C_{\bar{D}}$ of the sub-columns D and $\bar{D}$, the level of one of the parasitic capacitors $C_D$ and $C_{\bar{D}}$ of the sub-columns D and $\bar{D}$ determined by storing information of the memory cell $C_{oo}$ becomes below the threshold value of the MISFET $M_{13}$ or $M_{15}$ ahead of the level drop of the other of the parasitic capacitors $C_D$ and $C_{\bar{D}}$, making the driver MISFET $M_{13}$ or $M_{15}$ of the inverter connected to the sub-column D or $\bar{D}$, which is to be discharged, nonconductive. Assuming, by way of example, that the sub-column to be discharged by the storage information of the memory cell $C_{oo}$ is the sub-column D (when $C_4$ is charged and $C_5$ non-charged), then MISFET $M_{13}$ becomes nonconductive. Upon the nonconduction of the MISFET $M_{13}$, charging is initiated by the load MISFET $M_{12}$ into the sub-column $\bar{D}$ which is not to be discharged. Acccordingly, the original state with the sub-column D discharged and $\bar{D}$ charged is finally recovered.

In the above explanation, no reference has been made to the changes of the output impedances of the MISFETs due to the level changes. In actuality, the output impedance of the MISFET of the inverter connected to the sub-column, the level of which quickly drops, becomes high rapidly, to cause a long discharging time of the sub-column which is not to be discharged. Therefore, the change of the output impedance of the MISFET which maintains a high level and is conducting by this level and which forms the discharging path of the sub-column to be discharged is slow. In consequence, the difference between the discharging times of the two sub-columns becomes increasingly large.

3. Subsequently, the predetermined information of the row O is read-out by the column select signal. When, by way of example, column O is selected by column select signal $Y_o$, information stored in cell $C_{oo}$ is obtained.

As described above, in conformity with the present invention, the charge accumulated in the column is discharged by the memory cell and the two discharging paths of the MISFET circuit according to the present invention, so that the discharging time can be made short. In other words, high-speed operation is achieved.

Where the storage information of the memory cell in the sub-columns D and $\bar{D}$ is read-out by the column select signal $Y_o$, the present invention can solve the problem of a level decrese due to the charge sharing into a parasitic capacitor on the output side through the Y switch. The reason is that, if the level of the control signal $\phi$ is "on" also during the column select signal, charge can be supplied from the load MISFET of the inverter in a manner similar to that described above.

The read-out operation will be explained more in detail with reference to signal timing diagram of FIG. 5. The explanation will be made where MOSFETs $M_4$–$M_{16}$ are, for example, n channel type.

At time between $t_1$ and $t_2$ MISFETS $M_{10}$ and $M_{11}$ are nonconductive due to $Y_o$ being at a low level (ground level) which is applied to the gate electrodes thereof and parasitic capacitors $C_D$ and $C_{\bar{D}}$ are precharged through MISFETs $M_8$ and $M_9$ which are conductive due to a $\overline{CE}$ signal of a high or positive level "H".

Subsequently, parasitic capacitors $C_D$ and $C_{\bar{D}}$ are discharged through discharging paths $M_{15} - M_{16}$ and $M_{13} - M_{16}$, respectively, in response to application of a control signal $\phi$ of a high level at $t_3$.

At time $t_3$, assume for example, that, as storage information of memory cell $C_{oo}$, $C_4$ is charged to the "H" level, that is, $M_4$ is conductive, while $C_5$ is not charged, or the gate electrode of $M_5$ is at the "L" level. The parasitic capacitor $C_D$ is discharged through discharging path $M_6$–$M_4$, $M_6$ and $M_7$ being conductive in response to a row select signal $X_o$ applied at $t_4$ to the gate electrodes thereof.

As a consequence, the gate potential of $M_{13}$ is lowered and $M_{13}$ is nonconductive.

Simultaneously, the parasitic capacitor $C_{\bar{D}}$ is again charged, since the output voltage $V_{DD}$ of $M_{13}$ is supplied for the column $\bar{D}$.

At time $t_5$, the stored information of the parasitic capacitor $C_D$, which reflects the state of capacitor $C_5$, is read-out by a sense amplifier gate (not shown) through $M_{10}$. In FIG. 5, $V_{th}$ is the threshold value of the sense amplifier gate.

The dotted line referred to as prior art for curve D in FIG. 5 is a characteristic of a prior art memory circuit. According to the present invention, the time necessary for discharge can be shortened, that is, from $t_6$ to $t_5$. In FIG. 5, signals $X_o$ and $Y_o$ may be supplied at $t_3$ as shown by dotted lines.

The above embodiment attains a reduction of the discharging time by exploiting a feature of the memory device of the 4-element type memory cells, that stored normal information and reverse information are obtained.

Figure 2:
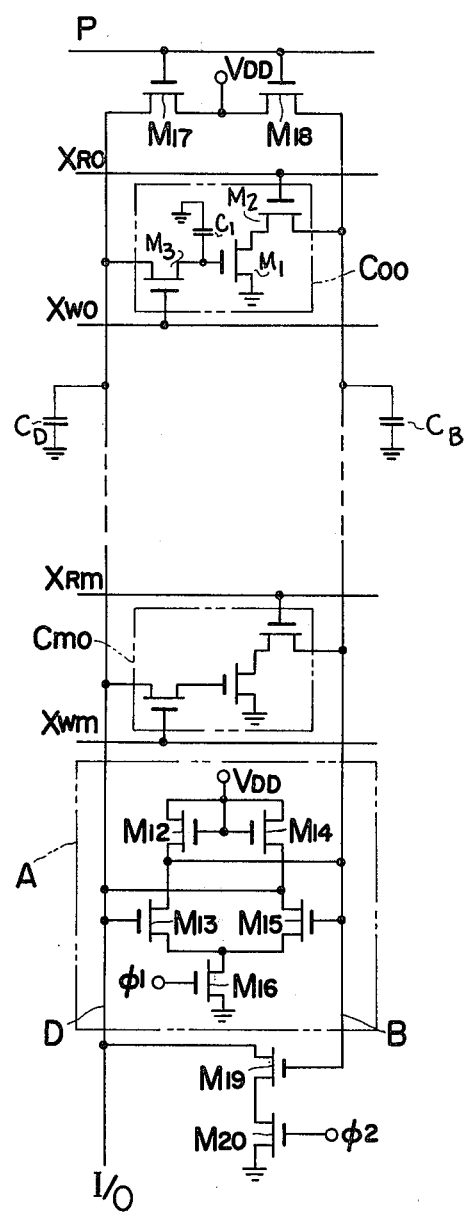
Figure 3:
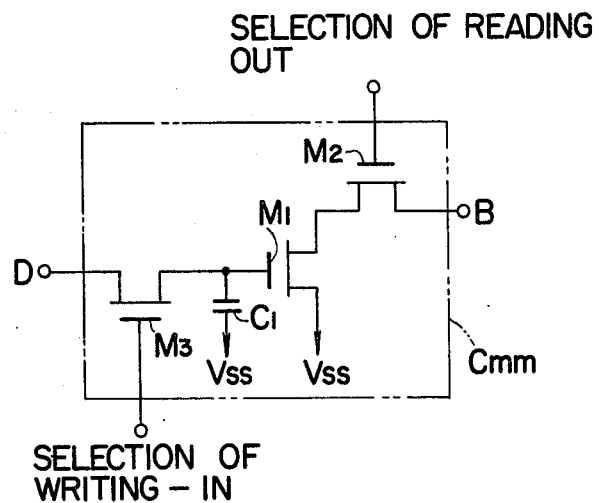
FIG. 3 shows a prior art memory cell of the 3-element type.

As is illustrated in FIG. 2, the present invention is also applicable to a 3-element type memory cell. As is shown in the figure, a sub-column D is a write-in line and a sub-column B is a read-out line in the memory device of the memory cells of the 3-element type. The memory device is the dynamic type, and requires a refresh operation. It is, therefore, necessary to invert the signal on the read-out line B and to transfer the inverted signal to the write-in line D. In general, input and output information I/O is applied to and read-out from the write-in line D. Accordingly, the sub-column D and the sub-column B have mutually opposite signals during the read-out operation.

In the following explanation of operation of the invention the same MISFET circuit A is employed as in the 4-element type for the sub-columns D and B.

1. The parasitic capacitor $C_D$ and $C_B$ of the sub-columns D and B are precharged by a control signal P.

(2) In reading-out the memory cell $C_{oo}$ by a read-out select signal $X_{RO}$, MISFETs $M_{16}$ and $M_{20}$ are rendered conductive by control signals $\phi_1$ and $\phi_2$. Then, when the memory MISFET $M_1$ of the memory cell $C_{oo}$ is conductive, when $C_1$ is charged, the discharging path of the parasitic capacitor of $C_D$ of the sub-column D is formed of a transfer MISFET $M_{19}$ and $M_{20}$, and the MISFETs $M_{16}$ and $M_{15}$ which is conducting by the charge accumulated in the parasitic capacitor $C_B$ of the sub-column B. On the other hand, the discharging path of the parasitic capacitor $C_B$ of the sub-column B is formed of the MISFETs $M_{16}$ and $M_{13}$ which is conducting by the charges accumulated in the parasitic capacitor $C_D$ of the sub-column D and the memory MISFET $M_1$ which is conducting by the stored charges in the memory capacitor $C_1$ of the memory cell $C_{oo}$. The output impedance of MISFETs $M_{13}$, $M_{15}$ and $M_{19}$ increases and it becomes difficult to discharge the charges with the level decrease due to the discharge of the accumulating charges of the parasitic capacitors $C_D$ and $C_B$ of the sub-columns D and B, whereas the output impedance of memory MISFET $M_1$, conducting by the storing charges of the memory cell, does not change. Therefore, the parasitic capacitor $C_B$ of the sub-column B is quickly discharged, and MISFETs $M_{15}$ and $M_{19}$ become nonconductive sooner. Consequently, the parasitic capacitor $C_D$ of the sub-column D is charged from the load MISFET $M_{14}$ into the original charged state, while the parasitic capacitor $C_B$ of the sub-column B is completely discharged.

Next, where the memory MISFET $M_1$ of the memory cell $C_{oo}$ is non-conductive (when $C_1$ is not charged), the discharging path of the sub-column D consists of MISFETs $M_{15}$ and $M_{16}$, and $M_{19}$ and $M_{20}$ as discussed above. Since the memory MISFET $M_1$ of the memory cell $C_{oo}$ is nonconductive, the discharging path of the sub-column B consists only of the MISFETs $M_{13}$ and $M_{16}$. Therefore, the MISFET $M_{13}$ becomes nonconductive sooner, and the sub-column B is charged from the load MISFET $M_{12}$. Thus, the original state with the sub-column D fully discharged and the sub-column B charged is established.

The read-out operation will be explained in more detail with reference to signal timing diagrams of FIGS. 6A and 6B. The explanation will be made with MOSFETs $M_1$–$M_3$ and $M_{12}$ – $M_{20}$ of, for example, n channel type.

Figure 6A:
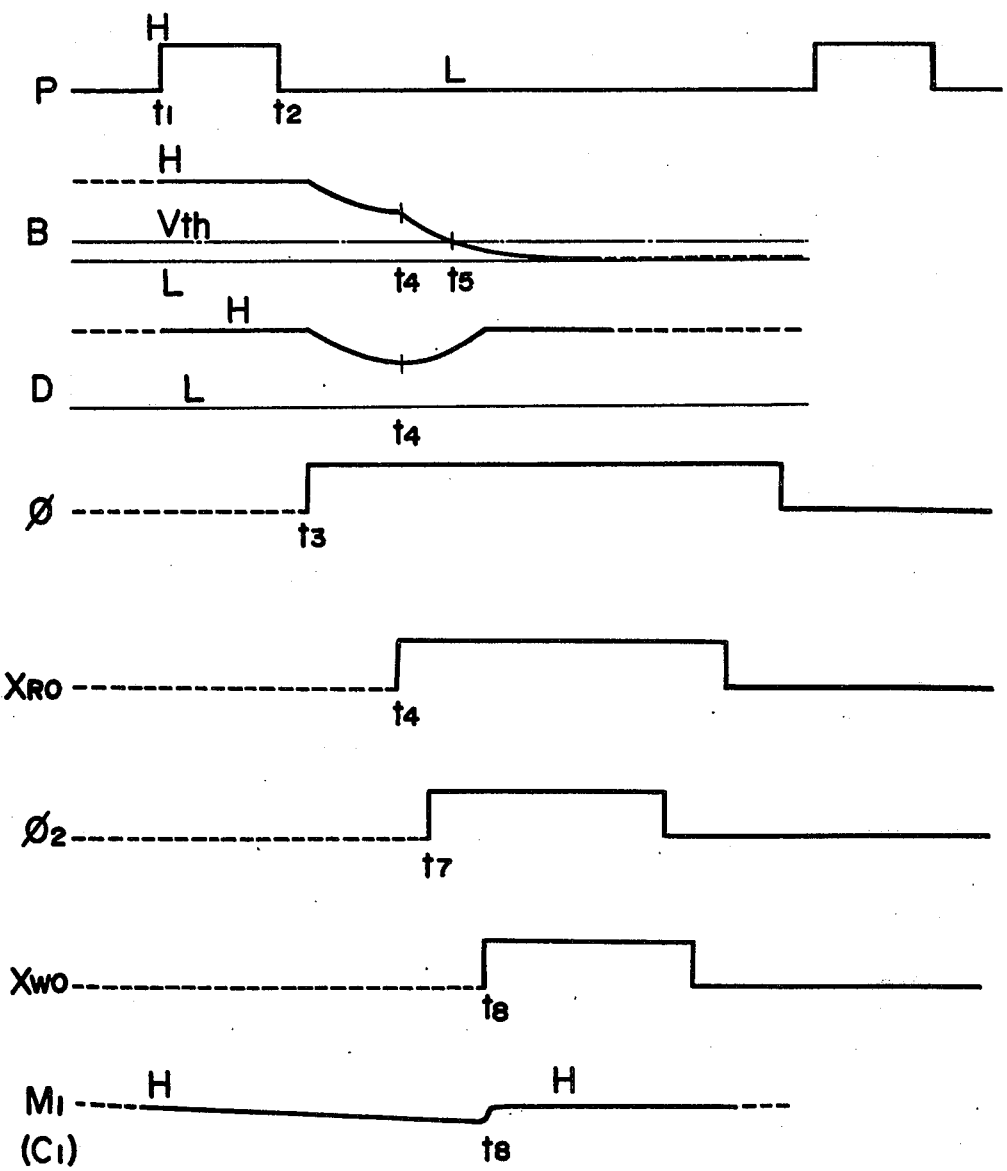

FIG. 6A shows a signal timing diagram for the embodiment of FIG. 2 wherein information stored in capacitor $C_1$ of a memory cell $C_{oo}$ is a high (or positive) level "H".

At a period of time between $t_1$ and $t_2$, $C_D$ and $C_B$ are precharged similarly, as in FIG. 1. After time $t_4$, $C_B$ is further discharged through a path $M_2$–$M_1$, since $M_1$ is made conductive due to the high level of a read-out select signal $X_{RO}$.

On the other hand, $C_D$ is again charged up to a high level similarly as in FIG. 1. Although $\phi_2$ of the high level is supplied for $M_{20}$ at $t_7$, the stored information of $C_D$ and $C_B$ is not affected due to the off-state of $M_{19}$.

At time $t_5$, the stored information in $C_D$, which reflects the state of $C_1$ of the memory cell $C_{oo}$, is read-out to the I/O line. At time $t_8$, the information of memory FET $M_1$ is refreshed in response to provision of $X_{WO}$ through $M_3$.

FIG. 6B shows a signal timing diagram of FIG. 2 wherein information stored in $C_1$ of a memory cell $C_{oo}$ is a low level "L".

At a period of time between $t_1$ and $t_2$, $C_D$ and $C_B$ are precharged as explained hereinabove.

Although $X_{RO}$ is supplied for $M_2$ at time $t_4$, $C_B$ is not discharged through $M_1$–$M_2$ since $M_1$ is made nonconductive due to the low level stored in $C_1$.

Subsequently, $C_D$ is further discharged through a path $M_{19}$–$M_{20}$ after time $t_7$ by provision of a signal $\phi_2$ of a high level applied to the gate electrode of $M_{20}$. As a consequence, $M_{13}$ is made nonconductive and $C_B$ is again charged up to a high level $V_{DD}$ through $M_{12}$. At time $t_5$, the information in $C_D$ which reflects the state of $C_1$ of $C_{oo}$ is read-out and at time $t_8$ the information of memory FET $M_1$ is refreshed through $M_3$.

The present invention is applicable to providing a high speed output line of an MIS memory and providing high speed operation for any other circuit which provides information by discharging a charged-level in a MISFET circuit.

While I have shown and described several embodiments in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed is:

1. An MIS type semiconductor memory device comprising:
    at least one memory cell each containing an information storage device therein;

first and second parasitic capacitors connected to said memory cell, the state of charge of at least one of which is representative of information stored in said at least one memory cell;

first means for individually addressing each of said cells for effecting the read-out of information stored therein;

second means for precharging said parasitic capacitors to a prescribed voltage level prior to addressing said cells for reading-out the information stored therein;

third means, connected to each of said first and second parasitic capacitors, for discharging said first and second parasitic capacitors in response to the charge accumulated on said second and first parasitic capacitors respectively, said third means comprising a first inverter circuit, responsive to the quantity of charge on said second parasitic capacitor, for providing a discharge path for said first parasitic capacitor, a second inverter circuit, responsive to the quantity of charge of said first parasitic capacitor, for providing a discharge path for said second parasitic capacitor, and a controlled switching device, connected in series with each of said first and second inverter circuits, for providing a common discharge path for each of said first and second parasitic capacitors; and a transfer circuit including a first switching circuit having a first control terminal connected to said second parasitic capacitor, an input terminal connected to said first parasitic capacitor, and an output terminal, for providing an additional discharge path for said first parasitic capacitor, and a second switching circuit having an input terminal connected to the output terminal of said first switching circuit, an output terminal connected to a source of reference potential, and a second control terminal; and wherein a first control signal is applied to said controlled switching device and a second control signal is applied to said second control terminal, said first control signal having a timing relationship relative to said second control signal such that said controlled switching device is rendered conductive prior to said second switching circuit during read-out of said at least one memory cell.

2. The improvement according to claim 1, wherein said controlled switching device comprises a first MOSFET having a source electrode connected to said source of reference potential, a drain electrode connected to each of said first and second inverter circuits, and a gate electrode connected to receive said first control signal, and said second switching circuit comprises a second MOSFET having a source electrode as its output terminal thereof, a drain electrode as its input terminal thereof, and a gate electrode as to said second control terminal.

3. The improvement according to claim 1, wherein said at least one memory cell contains a switching device, a storage device for controlling the switching of said switching device, and means for coupling said second parasitic capacitor to said switching device, in response to an address signal from said first means.

4. The improvement according to claim 3, wherein said memory device further includes fourth means for individually writing information in said storage device of each respective memory cell.

5. The improvement according to claim 4, wherein said at least one memory cell further includes means for coupling said storage device to said first parasitic capacitor in response to a write signal from said fourth means.

* * * * *